United States Patent
Hsieh et al.

[11] Patent Number: 5,903,435
[45] Date of Patent: May 11, 1999

[54] HEAT DISPERSING METHOD FOR IC OF PC BOARD AND ITS DEVICE

[76] Inventors: Shyn-Tsong Hsieh, 3F,No.29,Lane37,Po-chieh Street, Hsi-tz Town, Taipei Hsien; Wei-Tsung Tsai, No. 43,Min-shen Street, Liu-chia Village, Tainan Hsien, both of Taiwan

[21] Appl. No.: 08/958,218

[22] Filed: Oct. 27, 1997

[51] Int. Cl.⁶ .................................................. H05K 7/20
[52] U.S. Cl. ...................... 361/704; 361/690; 361/715; 361/752
[58] Field of Search .................................. 361/687–690, 361/704, 707, 709–710, 714–716, 730, 752, 753

[56] References Cited

U.S. PATENT DOCUMENTS

| 4,656,559 | 4/1987 | Fathi | 361/690 |
|---|---|---|---|
| 5,461,540 | 10/1995 | Lee | 361/707 |
| 5,461,541 | 10/1995 | Wentland, Jr. et al. | 361/707 |
| 5,742,472 | 4/1998 | Wu | 361/715 |

FOREIGN PATENT DOCUMENTS

| 2138797 | 5/1990 | Japan | 361/704 |
|---|---|---|---|

*Primary Examiner*—Gregory Thompson
*Attorney, Agent, or Firm*—Dougherty & Troxell

[57] ABSTRACT

A heat dispersing method for IC of PC boards has a first step of placing a heat dispersing member having an excellent heat dispersing character and a plastic feature directly on an IC, a second step of transmitting the heat of the IC directly to the heat dispersing member, a third step of positioning and combining the heat dispersing member with a housing of an electronic equipment, a fourth step of transmitting the hat of the heat dispersing member and in the housing through the housing and into open air. The device includes a housing housing, a PC board and a heat dispersing member to disperse out the heat of the IC quickly for prolonging its service life.

7 Claims, 6 Drawing Sheets

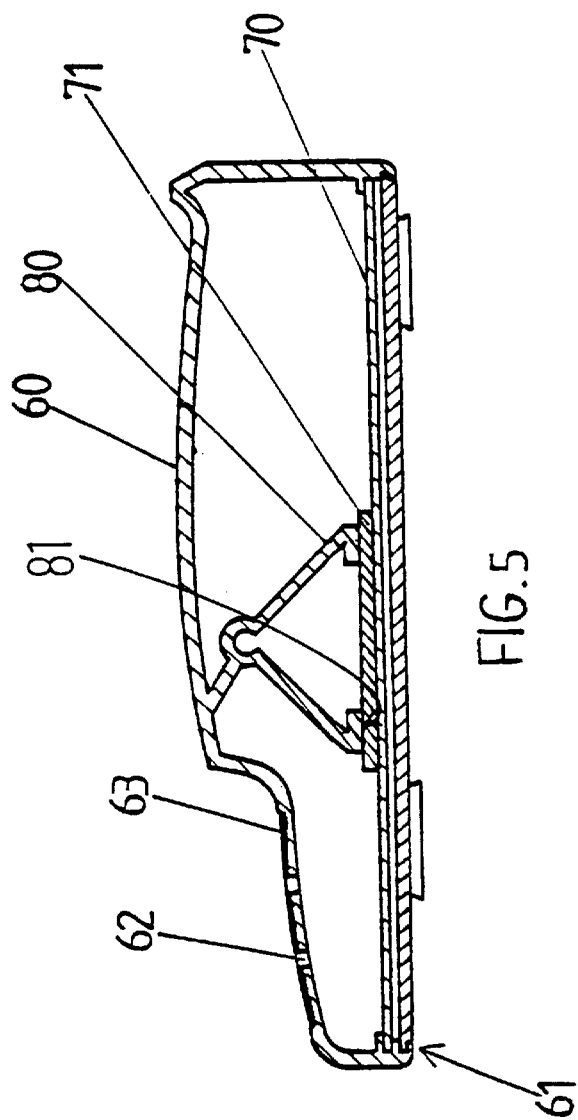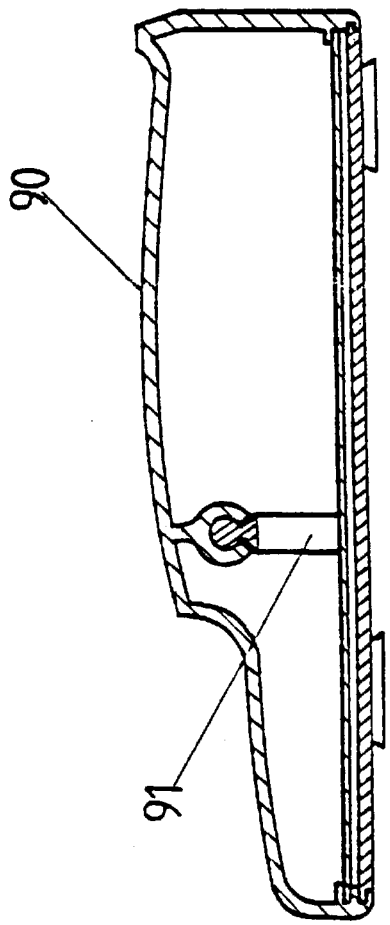

HEAT DISPERSING METHOD FOR IC OF PC BOARD AND ITS DEVICE

BACKGROUND OF THE INVENTION

This invention relates to a heat dispersing method for IC of PC boards and its device, particularly to one having reinforced structure, good heat dispersing function, practicality and prolonging IC service life.

A hub nowadays used in a computer network is usually made of either iron or plastic. But conventional hubs have inferior heat dispersing character, needing a heat dispersing member placed on an IC for quickly transmitting the heat produced by the IC to the heat dispersing member to reduce the heat of the IC to protect it from becoming short lived and from harming its electric features. (As high heat may shorten the service life of IC and increase electric and magnetic interference and signal transmitting interference). Then the high heat may disperse in an interior of the hub and exhausted out with a fan fixed at one end of the hub.

As seen from the above description, the hub should have a heat dispersing member and a fan for forcing quick dispersion of the heat of an IC to maintain its electric features and prolong its service life from a theoretical view point. But practically high heat of an IC is not completely exhausted out by the fan, still remaining in the interior of the hub, resulting in the inner heat reaching 70° C. or 80° C., not satisfying the object of those components. As for the hubs made of plastics, they function worse than those made of iron in dispersing heat.

SUMMARY OF THE INVENTION

A purpose of the invention is to offer a heat dispersing method for IC of PC boards, making use of excellent heat transmitting character of a material to increase contact dispersing dimensions for transmitting heat produced by an IC to open air.

Another purpose of the invention is to offer a heat dispersing device for IC of PC boards, possible to be assembled together by means of components modules.

One more purpose of the invention is to offer a heat dispersing method and device for IC of PC boards having a reinforced structure, quick heat dispersing function, convenient practicality and prolonging its service life.

The method in the invention includes four steps described below.
1. The first step: placing a bottom of a heat dispersing member, which has an excellent heat dispersing character and plastic feature, directly on an IC.
2. The second step: transmitting the high heat produced by the IC to the heat dispersing member by means of direct contact of the heat dispersing member and the IC.
3. The third step: combining the heat dispersing member with a housing of an electric equipment, permitting the IC, the heat dispersing member and the housing orderly and directly contact with each other.
4. The fourth step: transmitting the heat of the heat dispersing member and in the housing through the housing having an excellent heat dispersing characteristics and a large dimensions for dispersing heat into open air for swiftly reducing the heat of the IC.

The device includes a housing, a heat dispersing member and a PC.

The housing is made of a material having an excellent heat dispersing character and a plastic feature, having a generally sealed interior, an inner surface for positioning other components, and an outer surface contacting open air. The two sides of the housing are maybe provided with heat dispersing holes if needed.

The PC board is positioned on the inner surface of the housing, having an IC electrified through electric power terminals. During operation the IC produces high heat, which should be dispersed at once.

The heat dispersing member is made of a material having an excellent heat dispersing character and a plastic feature, positioned in the housing. The top of the heat dispersing member extends near an upper surface of the housing and its bottom surface directly contacts pressingly on the IC. So the heat of the IC may be transmitted and dispersed through the heat dispersing member, the housing and into open air quickly.

BRIEF DESCRIPTION OF DRAWINGS

This invention will be better understood by referring to the accompanying drawings, wherein:

FIG. 5 is a cross-sectional view of a second preferred embodiment of a heat dispersing device for IC of PC boards in the present invention;

FIG. 6 is a cross-sectional view of a third preferred embodiment of a heat dispersing device for IC of PC boards in the present invention; and, FIG. 7 is an elevational view of a PC board in the present invention.

DETAILED DESCRIPTION OF THE PREFERRED EMBODIMENTS

Figure 1:
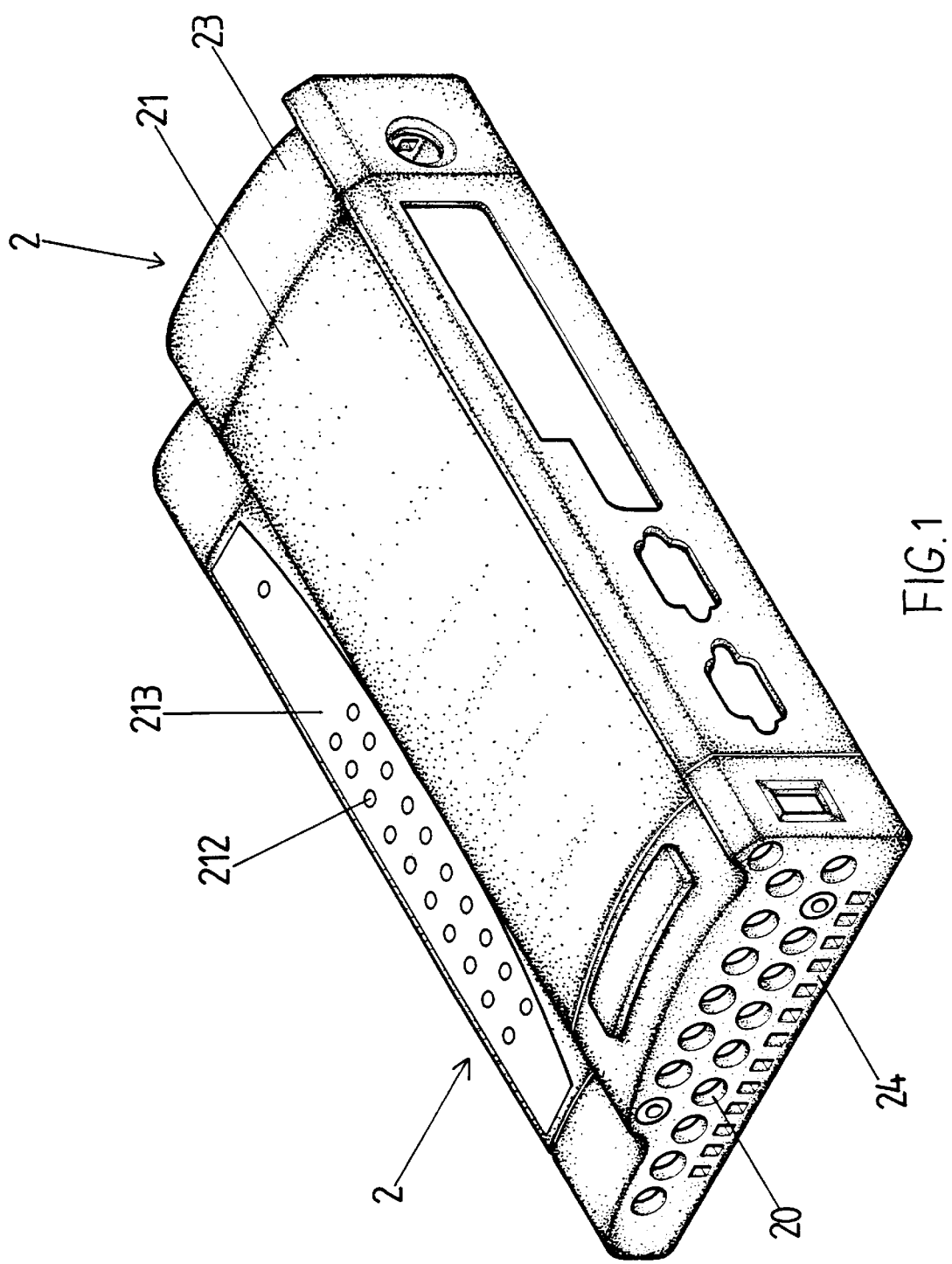
FIG. 1 is a perspective view of the first preferred embodiment of a heat dispersing device for IC of PC boards in the present invention.
Figure 2:
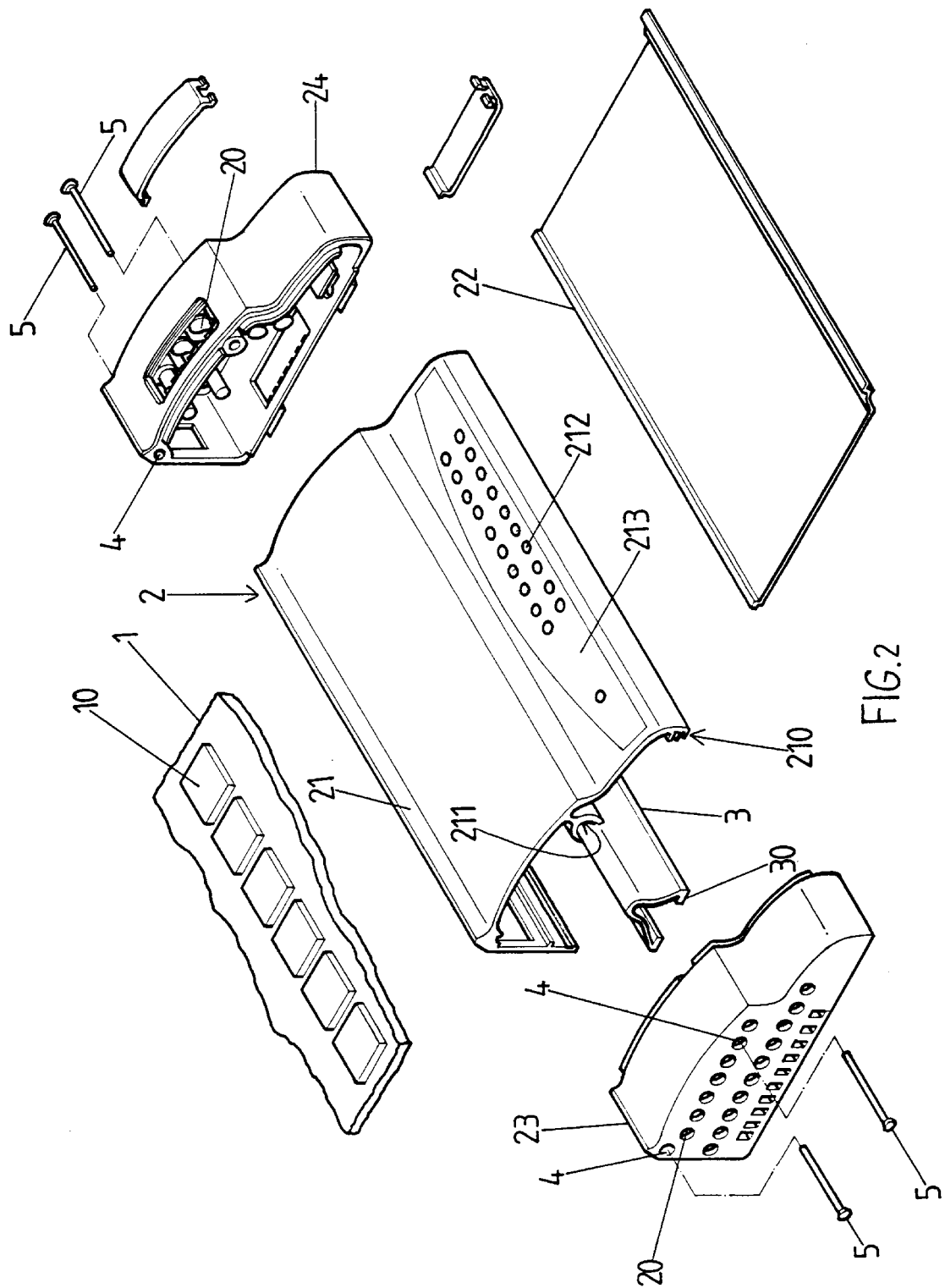
FIG. 2 is an exploded perspective view of a first preferred embodiment of a heat dispersing device for IC of PC boards in the present invention.
Figure 3:
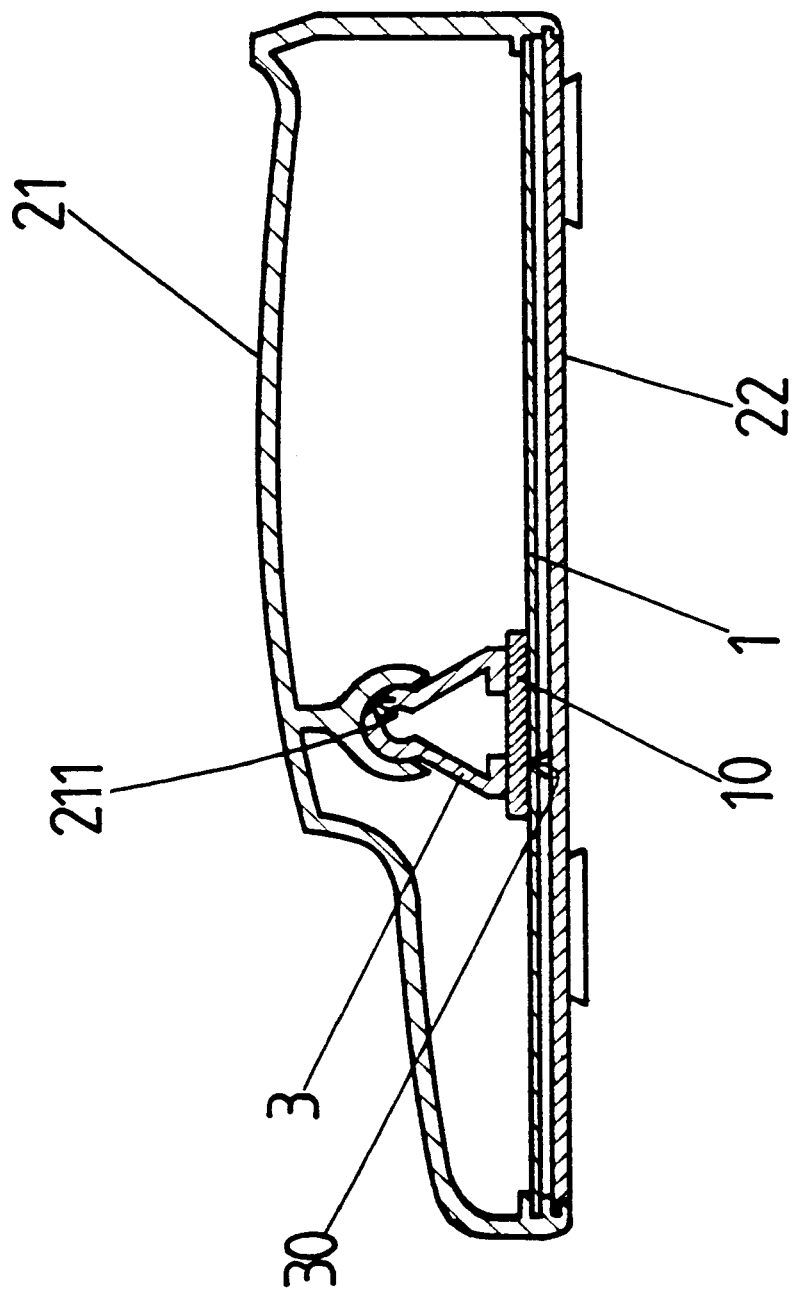
FIG. 3 is a cross-sectional view of the first preferred embodiment of a heat dispersing device for IC of PC boards in the present invention.
Figure 4:
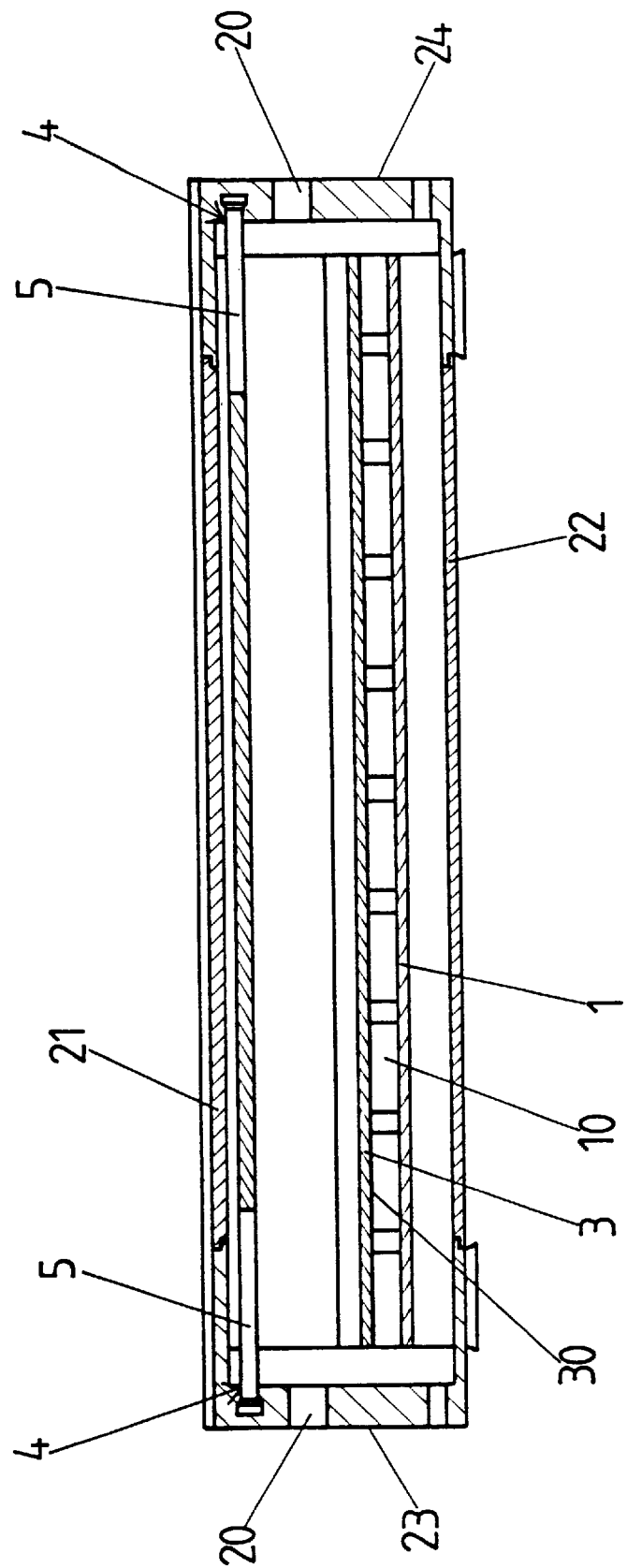
FIG. 4 is another cross-sectional view of the first preferred embodiment of a heat dispersing device for IC of PC boards in the present invention.
Figure 7:
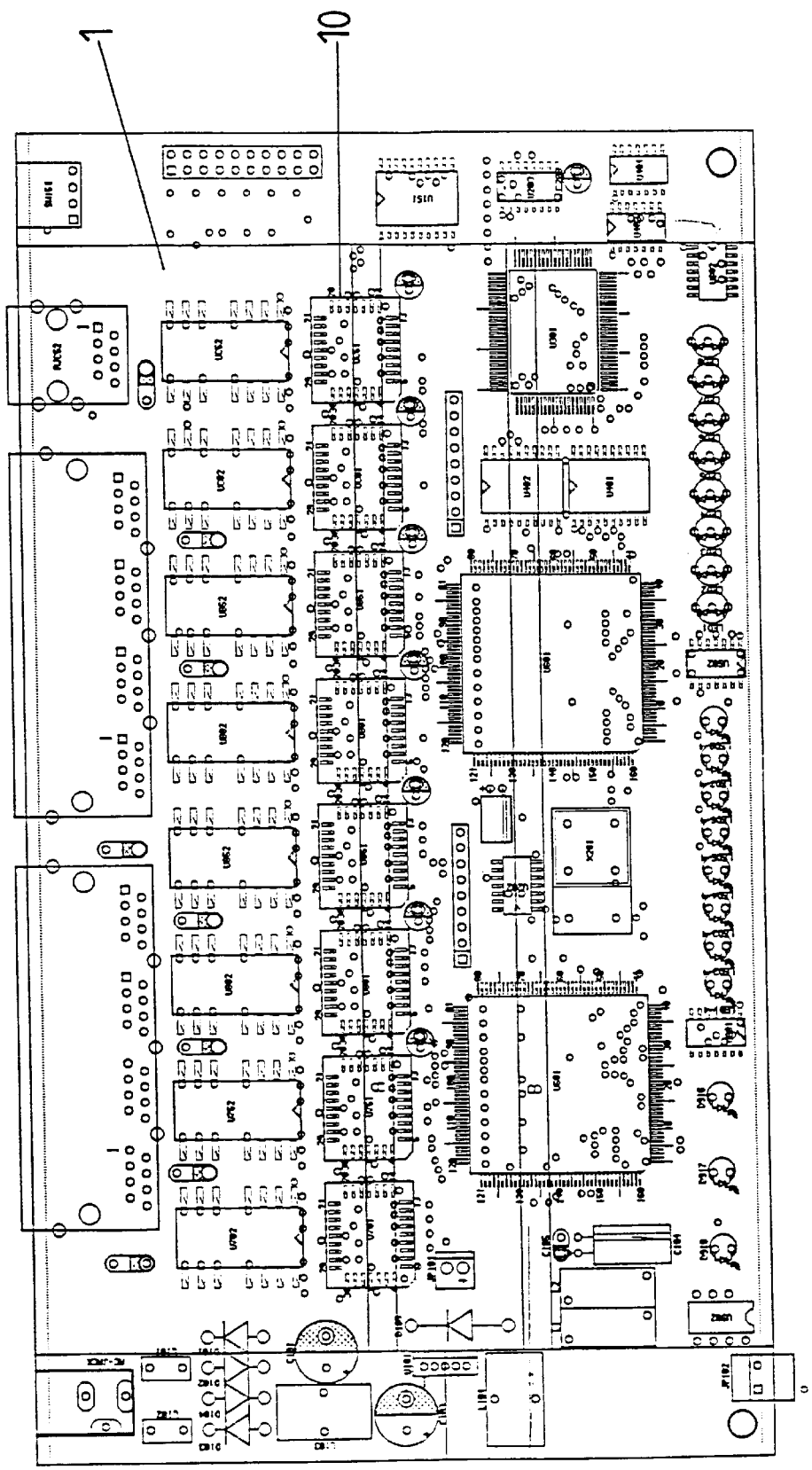

A heat dispersing method for IC of PC boards in the present invention, as shown in Figures accompanied, includes provision of a PC board 1 disposed in an electronic equipment such as communication network (or hub) electrified through electric power terminals. The heat produced by an IC10 on the PC board 1 during operation has to be dispersed at once (always being more than 70° C. or 80° C.). The electronic equipment commonly has a housing 2 and related components sealed therein. The higher operating frequency or gate count is, the higher the heat produced by the IC10 is. The heat dispersing method for IC of PC boards (a kind of PC board is shown in FIG. 7) in the present invention includes the following steps.

1. A first step is to place a bottom surface of a heat dispersing member 3 having an excellent heat dispersing characteristics and a plastic feature directly on an IC10 with pressure. The best material for the heat dispersing member 3 is aluminum having an excellent heat transmitting characteristics and a plastic feature, convenient for forming by injecting shooting process and in addition, the member 3 directly contact the IC10 in a line so as to increase dimensions of heat transmission.
2. A second step is to let the heat produced by IC10 transmitted to the dispersing member 3 by direct mutual contact. Then high heat of the IC10 can be very easily transmitted to the member 3, letting the heat of IC10 quickly reduced to below 40° C. or so, especially by direct mutual contact.

3. A third step is to position the member 3 in contact with a housing 2 of an electronic equipment, permitting IC10 contact directly orderly with the member 3 and then the housing 2. In the same principle, the housing 2 is preferably made of aluminum for forming by by injecting shooting process as the dispersing member is formed. In addition, a number of heat dispersing holes 20 may be formed in two sides of the housing 2 for helping disperse heat (if the heat of IC is not high, these holes 20 are not needed). Besides, the heat dispersing member 3 may be formed integral in an inner surface of the housing 2.

4. A fourth step is to transmit high heat both of the heat dispersing member 3 and in the housing through the housing 2 having a large dimensions and an excellent dispersing characteristics and then cooled by open air. Then the high heat of the IC is easily transmitted from the member 3 to the housing 2 for quick dispersing by the large dimensions and cooling function by open air, especially by means of direct contact and increased dispersing dimensions, reducing the inside heat of the housing, from 70° C.–80° C. to 40° C. or below than that.

A first preferred embodiment of a heat dispersing device for IC of PC boards in the present invention, as shown in FIGS. 1, 2, 3 and 4, includes a PC board 1 positioned in an electronic equipment such as communication network (or a hub) and electrified through electric power terminals. During operation, an IC10 fixed on the PC board 1 produces high heat, which should be dispersed at once so as to protect it from becoming short lived and having its electric features damaged. The electronic equipment generally has a housing sealing the equipment and related components in its interior, and also transmitting the heat of IC10 at the same time. The higher use frequency or gate count is, the higher the heat produced by IC10 will be.

The first preferred embodiment of a heat dispersing device further includes a housing 2 made of a material having an excellent heat dispersing characteristics and a plastic feature, a generally sealed interior for disposing other components therein. The outer surface of the housing 2 directly contact open air, and may have a number of heat dispersing hole 20 respectively formed in two sides, if necessary. The housing 2 is preferably made of a material such as aluminum, which has an excellent heat transmitting characteristics and a plastic feature for injecting shooting process.

The first preferred embodiment of a heat dispersing device further includes a heat dispersing member 3 made of a material having an excellent heat transmitting characteristics and a plastic feature, positioned in the housing 2. The heat dispersing member 3 has its top near an inner upper surface of the housing 2, and its bottom surface pressingly contacting directly on the IC10 so that the high heat produced by it may be transmitted through the member 3, the housing 2 and into open air. The heat dispersing member 3 is preferably made of aluminum as the housing 2 is, for the same reason described above. In addition, the heat dispersing member 3 and IC 10 directly contact with each other in a line so as to increase dispersing dimensions, with a substantially flat contact surface 30 formed on the bottom of the dispersing member 3.

The housing 2 consists of an upper body 21, a lower body 22, a left side cover 23, and a right side cover 24.

The upper body 21 is a little curved-up bent plate, having a front side and a rear side respectively formed with a position slide groove group 210 for the two sides of the PC board 1 to engage slidably with a pair of the position slide grooves 210 with quickness. The dispersing member 3 has its top able to fit in a groove 211 on an inner surface of the upper body 21. A long narrow indicate lamp wicket 212 with many holes is disposed near the front side of the upper body 21 and a long name plate 213 is adhered along the lamp wicket 212. The dispersing member 3 can be formed integral with the housing 2 or separately made and combined with the housing 2.

The lower body 22 is a generally flat bent plate, and engages slidably with another pair of the position slide grooves 210 of the upper body 21.

The left side cover 23 is positioned at a left side of the upper body 21, and maybe provided with plural dispersing holes 20 if needed.

The right side cover 24 is positioned at a right side of the upper body 21, and maybe provided with plural dispersing holes 20 if needed. Further, the right side cover 24 and the upper body 21 both have connect holes 4 in their contact portions for fastening means 5 to combine the right side cover 24 and the connect holes 4 tightly and securely. The fastening means 5 are hidden in the connect holes 4, not protruding out of the holes 4 for safety so as to make the design of every component of the present invention complete.

FIG. 5 shows a second preferred embodiment of a heat dispersing device for IC of PC boards in the present invention, which has the dispersing member formed integral with the housing or separately made and combined with the housing.

The second embodiment has an upper body 60 of the housing 2 also made of a little curved up bent plate with two—front and rear—sides bent down and formed with position slide groove group 61 so that PC board 70 has two sides engaging slidably one pair of the position slide grooves 61 and is positioned securely. A heat dispersing member 80 is formed integral with the upper body 60, with its top connected with an inner surface of the upper body 60. Or the dispersing member 80 is separately made and disposed on the inner surface of the upper body 60. Further, the dispersing member 80 and an IC71 preferably contact with each other in a line so as to increase transmitting dimensions for quickly dispersing heat. So the dispersing member 80 has a substantially flat bottom surface 81 to contact with the IC71 to increase mutual contact dimensions. A long indicate lamp wicket 62 may be provided near the front side on the upper surface of the upper body 60, with a long name plate 63 adhered along the wicket 62 and facing holes of the wicket 62.

FIG. 6 shows a third preferred embodiment of a heat dispersing device for IC of PC boards in the present invention, which includes an upright IC91 (or a semiconductor) instead of the IC 10 in the first and the second embodiment, connected directly with an upper body 90 of the housing. Further, fastening means can be used to fix the upper body 90 tightly with the two side covers as used in the second embodiment.

While the preferred embodiments of the invention have been described above, it will be recognized and understood that various modifications may be made therein and the appended claims are intended to cover all such modifications which may fall within the spirit and scope of the invention.

What is claimed is:

1. A heat dispersing device for a PC board having at least one integrated circuit (IC) wherein the at least one IC is positioned in a housing and electrified through electric power terminals, whereby the at least one IC produces high heat during operation, the device comprising:

the housing made of a material having high heat transmitting characteristics and bounding an interior, the housing having an outer surface contacting ambient air, and a plurality of dispersing holes provided in two sides;

the PC board and the at least one IC positioned within said interior of said housing; and an elongated heat dispersing member made of a material having high heat dispersing characteristics positioned within the interior of said housing, having a top in contact with an upper inner surface of said housing and a plurality of substantially flat, spaced apart contact surfaces in direct contact with said at least one IC so that the heat of said at least one IC is transmitted through said elongated heat dispersing member, said housing and into ambient air.

2. The heat dispersing device for the at least one IC as claimed in claim 1, wherein said housing further comprises:

a curved upper body having front and rear sides each respectively formed with a plurality of pairs of position slide grooves in an inner side, to slidably engage sides of said PC board;

a generally flat lower body having two sides slidably engaging one pair of said position slide grooves of said upper body;

a left side cover positioned at a left side of said upper body, and having a plurality of first heat dispersing holes for helping to disperse heat; and, a right side cover positioned at a right side of said upper body, and having a plurality of second heat dispersing holes for helping to disperse heat.

3. The heat dispersing device for the at least one IC as claimed in claim 2, wherein said elongated heat dispersing member is made of aluminum.

4. The heat dispersing device for the at least one IC as claimed in claim 2, wherein said housing is made of aluminum.

5. The heat dispersing device for the at least one IC as claimed in claim 2, wherein said upper body of said housing further comprises an elongated indicate lamp wicket adjacent the front side and a long name plate mounted on said wicket.

6. The heat dispersing device for the at least one IC as claimed in claim 2, wherein said upper body and said left and said right side covers have connect holes for fastening means to engage to affix them together.

7. The heat dispersing device for the at least one IC as claimed in claim 2, wherein said at least one IC is positioned upright, having a top directly fitted in said elongated heat dispersing member.

\* \* \* \* \*